United States Patent
Shifren et al.

(10) Patent No.: US 8,377,783 B2
(45) Date of Patent: Feb. 19, 2013

(54) METHOD FOR REDUCING PUNCH-THROUGH IN A TRANSISTOR DEVICE

(75) Inventors: Lucian Shifren, San Jose, CA (US); Taiji Ema, Mie-ken (JP)

(73) Assignee: Suvolta, Inc., Los Gatos, CA (US)

( * ) Notice: Subject to any disclaimer, the term of this patent is extended or adjusted under 35 U.S.C. 154(b) by 0 days.

(21) Appl. No.: 12/895,695

(22) Filed: Sep. 30, 2010

(65) Prior Publication Data

US 2012/0083080 A1    Apr. 5, 2012

(51) Int. Cl.
    *H01L 21/336*    (2006.01)
(52) U.S. Cl. .................. 438/289; 257/376; 257/E21.443
(58) Field of Classification Search .............. 257/376, 257/E21.443
    See application file for complete search history.

(56) References Cited

U.S. PATENT DOCUMENTS

| | | |
|---|---|---|
| 3,958,266 A | 5/1976 | Athanas |
| 4,000,504 A | 12/1976 | Berger |
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,578,128 A | 3/1986 | Mundt et al. |
| 4,617,066 A | 10/1986 | Vasudev |
| 4,761,384 A | 8/1988 | Neppl et al. |
| 4,819,043 A | 4/1989 | Yazawa et al. |
| 4,908,681 A | 3/1990 | Nishida et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,298,763 A | 3/1994 | Shen et al. |
| 5,369,288 A | 11/1994 | Usuki |
| 5,384,476 A | 1/1995 | Nishizawa et al. |
| 5,426,279 A | 6/1995 | Dasgupta |
| 5,426,328 A | 6/1995 | Yilmaz et al. |
| 5,444,008 A | 8/1995 | Han et al. |
| 5,559,368 A | 9/1996 | Hu et al. |

(Continued)

FOREIGN PATENT DOCUMENTS

| | | |
|---|---|---|
| EP | 0274278 | 7/1988 |
| EP | 0683 515 | 11/1995 |

(Continued)

OTHER PUBLICATIONS

PCT Notice of Transmittal of the International Search Report and the Written Opinion of the International Search Authority, or the Declaration, PCT/US2011/026587, 9 pp. dated May 10, 2011.

(Continued)

*Primary Examiner* — Michelle Mandala
*Assistant Examiner* — Shaka White
(74) *Attorney, Agent, or Firm* — Baker Botts L.L.P.

(57) ABSTRACT

Punch-through in a transistor device is reduced by forming a well layer in an implant region, forming a stop layer in the well layer of lesser depth than the well layer, and forming a doped layer in the stop layer of lesser depth than the stop layer. The stop layer has a lower concentration of impurities than the doped layer in order to prevent punch-through without increasing junction leakage.

6 Claims, 1 Drawing Sheet

U.S. PATENT DOCUMENTS

| | | |
|---|---|---|
| 5,608,253 A | 3/1997 | Liu et al. |
| 5,622,880 A | 4/1997 | Burr et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,756,365 A * | 5/1998 | Kakumu ............. 438/304 |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,889,315 A | 3/1999 | Farrenkopf et al. |
| 5,895,954 A | 4/1999 | Yasumura et al. |
| 5,923,987 A | 7/1999 | Burr |
| 5,985,705 A | 11/1999 | Seliskar |
| 5,989,963 A | 11/1999 | Luning et al. |
| 6,020,227 A | 2/2000 | Bulucea |
| 6,087,210 A | 7/2000 | Sohn |
| 6,087,691 A | 7/2000 | Hamamoto |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,218,895 B1 | 4/2001 | De et al. |
| 6,229,188 B1 | 5/2001 | Aoki et al. |
| 6,245,618 B1 | 6/2001 | An et al. |
| 6,271,070 B2 * | 8/2001 | Kotani et al. ............. 438/207 |
| 6,288,429 B1 | 9/2001 | Iwata et al. |
| 6,300,177 B1 | 10/2001 | Sundaresan et al. |
| 6,313,489 B1 | 11/2001 | Letavic et al. |
| 6,320,222 B1 | 11/2001 | Forbes et al. |
| 6,326,666 B1 | 12/2001 | Bernstein et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,279 B1 | 7/2002 | Huster et al. |
| 6,444,550 B1 | 9/2002 | Hao et al. |
| 6,444,551 B1 | 9/2002 | Ku et al. |
| 6,461,920 B1 | 10/2002 | Shirahata et al. |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,534,373 B1 | 3/2003 | Yu |
| 6,541,829 B2 | 4/2003 | Nishinohara et al. |
| 6,548,842 B1 | 4/2003 | Bulucea et al. |
| 6,551,885 B1 | 4/2003 | Yu |
| 6,573,129 B2 | 6/2003 | Hoke et al. |
| 6,600,200 B1 | 7/2003 | Lustig et al. |
| 6,620,671 B1 | 9/2003 | Wang et al. |
| 6,624,488 B1 | 9/2003 | Kim |
| 6,630,710 B1 | 10/2003 | Augusto |
| 6,660,605 B1 | 12/2003 | Liu |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,753,230 B2 | 6/2004 | Sohn et al. |
| 6,770,944 B2 | 8/2004 | Nishinohara et al. |
| 6,787,424 B1 | 9/2004 | Yu |
| 6,797,994 B1 | 9/2004 | Hoke et al. |
| 6,808,994 B1 | 10/2004 | Wang |
| 6,821,825 B2 | 11/2004 | Todd et al. |
| 6,822,297 B2 | 11/2004 | Nandakumar et al. |
| 6,831,292 B2 | 12/2004 | Currie et al. |
| 6,881,641 B2 | 4/2005 | Wieczorek et al. |
| 6,881,987 B2 | 4/2005 | Sohn |
| 6,893,947 B2 | 5/2005 | Martinez et al. |
| 6,916,698 B2 | 7/2005 | Mocuta et al. |
| 6,930,007 B2 | 8/2005 | Bu et al. |
| 6,930,360 B2 | 8/2005 | Yamauchi et al. |
| 6,963,090 B2 | 11/2005 | Passlack et al. |
| 7,002,214 B1 | 2/2006 | Boyd et al. |
| 7,008,836 B2 | 3/2006 | Algotsson et al. |
| 7,015,546 B2 | 3/2006 | Herr et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,515 B2 | 8/2006 | Hanafi et al. |
| 7,119,381 B2 | 10/2006 | Passlack |
| 7,122,411 B2 | 10/2006 | Mouli |
| 7,170,120 B2 | 1/2007 | Datta et al. ............. 257/288 |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,235,822 B2 | 6/2007 | Li |
| 7,294,877 B2 | 11/2007 | Ruecks et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,427,788 B2 | 9/2008 | Li et al. |
| 7,442,971 B2 | 10/2008 | Wirbeleit et al. |
| 7,462,908 B2 | 12/2008 | Bol et al. |
| 7,485,536 B2 | 2/2009 | Jin et al. |
| 7,491,988 B2 | 2/2009 | Tolchinsky et al. |
| 7,494,861 B2 | 2/2009 | Chu et al. |
| 7,498,637 B2 | 3/2009 | Yamaoka et al. |
| 7,501,324 B2 | 3/2009 | Babcock et al. |
| 7,507,999 B2 | 3/2009 | Kusumoto et al. |
| 7,521,323 B2 | 4/2009 | Surdeanu et al. |
| 7,531,393 B2 | 5/2009 | Doyle et al. |
| 7,538,412 B2 | 5/2009 | Schulze et al. |
| 7,564,105 B2 | 7/2009 | Chi et al. |
| 7,566,600 B2 | 7/2009 | Mouli |
| 7,592,241 B2 | 9/2009 | Takao |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,642,140 B2 | 1/2010 | Bae et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,675,126 B2 | 3/2010 | Cho |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,750,405 B2 | 7/2010 | Nowak |
| 7,750,682 B2 | 7/2010 | Bernstein et al. |

| | | |
|---|---|---|
| 7,755,146 B2 | 7/2010 | Helm et al. |
| 7,759,714 B2 | 7/2010 | Itoh et al. |
| 7,795,677 B2 | 9/2010 | Bangsaruntip et al. |
| 7,818,702 B2 | 10/2010 | Mandelman et al. |
| 7,829,402 B2 | 11/2010 | Matocha et al. |
| 7,867,835 B2 | 1/2011 | Lee et al. |
| 7,883,977 B2 | 2/2011 | Babcock et al. |
| 7,888,747 B2 | 2/2011 | Hokazono |
| 7,897,495 B2 | 3/2011 | Ye et al. |
| 7,906,413 B2 | 3/2011 | Cardone et al. |
| 7,906,813 B2 | 3/2011 | Kato |
| 7,919,791 B2 | 4/2011 | Flynn et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 8,004,024 B2 | 8/2011 | Furukawa et al. |
| 8,012,827 B2 | 9/2011 | Yu et al. |
| 8,039,332 B2 | 10/2011 | Bernard et al. |
| 8,048,791 B2 | 11/2011 | Hargrove et al. |
| 8,048,810 B2 | 11/2011 | Tsai et al. |
| 8,067,279 B2 | 11/2011 | Sadra et al. |
| 8,105,891 B2 | 1/2012 | Yeh et al. |
| 8,106,424 B2 | 1/2012 | Schruefer |
| 8,106,481 B2 | 1/2012 | Rao |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,173,502 B2 | 5/2012 | Yan et al. |
| 8,178,430 B2 | 5/2012 | Kim et al. |
| 8,183,096 B2 | 5/2012 | Wirbeleit |
| 8,183,107 B2 | 5/2012 | Mathur et al. |
| 8,236,661 B2 | 8/2012 | Dennard et al. |
| 2001/0014495 A1 | 8/2001 | Yu |
| 2002/0033511 A1* | 3/2002 | Babcock et al. ............. 257/408 |
| 2002/0042184 A1 | 4/2002 | Nandakumar et al. |
| 2003/0047763 A1* | 3/2003 | Hieda et al. .................... 257/288 |
| 2003/0122203 A1 | 7/2003 | Nishinohara |
| 2003/0183856 A1 | 10/2003 | Wieczorek |
| 2004/0053457 A1* | 3/2004 | Sohn ............................. 438/197 |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0180488 A1 | 9/2004 | Lee |
| 2005/0056877 A1 | 3/2005 | Rueckes et al. .............. 257/300 |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0017100 A1 | 1/2006 | Bol et al. ....................... 257/331 |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0091481 A1 | 5/2006 | Li et al. ........................ 257/401 |
| 2006/0154428 A1 | 7/2006 | Dokumaci |
| 2006/0157794 A1 | 7/2006 | Doyle et al. .................. 257/368 |
| 2007/0040222 A1 | 2/2007 | Van Camp et al. |
| 2007/0158790 A1 | 7/2007 | Rao |
| 2007/0238253 A1 | 10/2007 | Tucker |
| 2008/0067589 A1 | 3/2008 | Ito et al. |
| 2008/0108208 A1* | 5/2008 | Arevalo et al. ............... 438/514 |
| 2008/0138953 A1 | 6/2008 | Challa et al. ................. 438/270 |
| 2008/0169493 A1 | 7/2008 | Lee et al. |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0003105 A1 | 1/2009 | Itoh et al. ..................... 365/203 |
| 2009/0057746 A1 | 3/2009 | Sugll et al. |
| 2009/0057762 A1 | 3/2009 | Bangsaruntip et al. ....... 257/347 |
| 2009/0108350 A1* | 4/2009 | Cai et al. ...................... 257/347 |
| 2009/0121298 A1 | 5/2009 | Furukawa et al. ............ 257/412 |
| 2009/0134468 A1 | 5/2009 | Tsuchiya et al. |
| 2009/0302388 A1 | 12/2009 | Cai et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0149854 A1 | 6/2010 | Vora |
| 2010/0187641 A1 | 7/2010 | Zhu et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2012/0021594 A1 | 1/2012 | Gurtej et al. |
| 2012/0056275 A1 | 3/2012 | Cai et al. |
| 2012/0108050 A1 | 5/2012 | Chen et al. |
| 2012/0190177 A1 | 7/2012 | Kim et al. |

FOREIGN PATENT DOCUMENTS

| | | |
|---|---|---|
| EP | 1 450 394 A1 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO2011/062788 | 5/2011 |

OTHER PUBLICATIONS

Shao, et al. "Boron diffusion in silicon: the anomalies and control by point defect engineering" Materials Science and Engineering R: Reports, vol. 42, No. 3-4, Nov. 1, 2003 pp. 65-114.

Yan, et al., "Scaling the Si MOSFET: From Bulk to SOI to Bulk", IEEE Transactions on Electron Devices, IEEE Service Center, Pisacataway, NJ, US, vol. 39, No. 7, Jul. 1, 1992 pp. 1704-1710.

Abiko, H et al., "A Channel Engineering Combined with Channel Epitaxy Optimization and TED Suppression for 0.15μm n-n Gate CMOS Technology", 1995 Symposium on VLSI Technology Digest of Technical Papers, pp. 23-24, 1995.

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-On-Insulator nMOSFETs with Tensile Strained High Carbon Content $Si_{1-y}C_y$ Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, DK "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

Laveant, P. "Incorporation, Diffusion and Agglomeration of Carbon in Silicon", Solid State Phenomena, vols. 82-84, pp. 189-194, 2002.

Noda, K et al., "A 0.1-μm Delta-Doped MOSFET Fabricated with Post-Low-Energy Implanting Selective Epitaxy" IEEE Transactions on Electron Devices, vol. 45, No. 4, pp. 809-814, Apr. 1998.

Ohguro, T et al., "An 0.18-μm CMOS for Mixed Digital and Analog Aplications with Zero-Volt-Vth Epitaxial-Channel MOSFET's", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

US 7,011,991, 03/2006, Algotsson et al. (withdrawn).

Matsuhashi, et al. "High-performance double-layer epitaxial-channel PMOSFET compatible with a single gate CMOSFETt", Proceedings of 1996 VLSI Symp. on VLSI Tech., pp. 36-37, 1996.

Robertson, LS et al., "The Effect of Impurities on Diffusion and Activation of Ion Implanted Boron in Silicon", Mat. Res. Soc. Symp. vol. 610, 2000.

Scholz, R et al., "Carbon-Induced Undersaturation of Silicon Self-Interstitials", Appl. Phys. Lett. 72(2), pp. 200-202, Jan. 1998.

Scholz, RF et al., "The Contribution of Vacancies to Carbon Out-Diffusion in Silicon", Appl. Phys. Lett., vol. 74, No. 3, pp. 392-394, Jan. 1999.

Stolk, PA et al., "Physical Mechanisms of Transient Enhanced Dopant Diffusion in IonImplanted Silicon", J. Appl. Phys. 81(9), pp. 6031-6050, May 1997.

Thompson, S et al., "MOS Scaling: Transistor Challenges for the 21st Century", Intel Technology Journal Q3' 1998, pp. 1-19, 1998.

Wann, C. et al., "Channel Profile Optimization and Device Design for Low-Power High-Performance Dynamic-Threshold MOSFET", IEDM 96, pp. 113-116, 1996.

Werner, P et al., "Carbon Diffusion in Silicon", Applied Physics Letters, vol. 73, No. 17, pp. 2465-2467, Oct. 1998.

\* cited by examiner

METHOD FOR REDUCING PUNCH-THROUGH IN A TRANSISTOR DEVICE

TECHNICAL FIELD

The present disclosure relates in general to semiconductor fabrication processes and more particularly to a method for reducing punch-through in a transistor device.

BACKGROUND

There is a move to provide lower and lower fluctuation of threshold voltages Vt in transistor devices. One method of lowering Vt fluctuation is to stack extremely low impurity concentration channel layer over a very high impurity concentration layer. However, the cost in doing so results in increasing junction leakage that may negatively impact device operation. One way to minimize junction leakage is to minimize the thickness of the high impurity concentration layer and to set source and drain regions penetrating the high impurity concentration layer and thus minimize junction area between source and drain regions and Vt control. However, deep source and drain regions penetrate through the Vt control causing punch-through. Punch-through is associated with the merging of source and drain depletion layers, when the drain depletion layer extends across the substrate and reaches the source depletion layer to cause a destructive conduction path or leakage current between the source and drain.

SUMMARY

From the foregoing, it may be appreciated by those skilled in the art that a need has arisen for a technique that can eliminate the effects of punch-through and minimize threshold voltage fluctuation in a transistor device. In accordance with the present disclosure, a method of minimizing punch-through in a transistor device is provided that substantially eliminates or greatly reduces problems and limitations associated with conventional semiconductor fabrication processes.

According to an embodiment of the present disclosure, there is provided a method for reducing punch-through in a transistor device that includes forming a well layer in an implant region, forming a stop layer in the well layer of lesser depth than the well layer, and forming a doped layer in the stop layer of lesser depth than the stop layer. The stop layer has a lower concentration of impurities than the doped layer.

The present disclosure provides various technical advantages over devices made by conventional semiconductor fabrication processes. For example, one technical advantage is in the reduction of the punch-through effect on a transistor device. Another technical advantage is to use a punch-through stop layer having a lower concentration of dopant impurities than a doped layer to provide small threshold voltage fluctuation and thus low operating voltage control without increasing junction leakage. Embodiments of the present disclosure may enjoy some, all, or none of these advantages. Other technical advantages may be readily apparent to one skilled in the art from the following figures, description, and claims.

BRIEF DESCRIPTION OF THE DRAWINGS

For a more complete understanding of the present disclosure and the advantages thereof, reference is made to the following description taken in conjunction with the accompanying drawings, wherein like reference numerals represent like parts in which.

DETAILED DESCRIPTION

Figure 1:
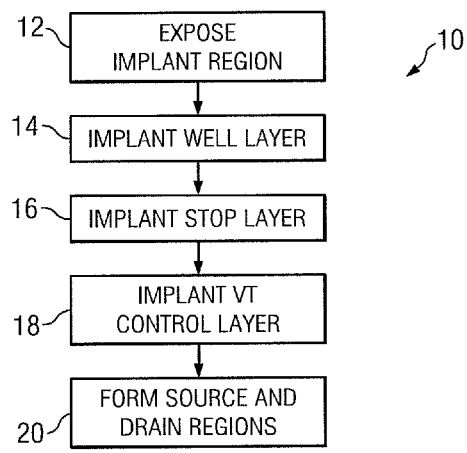
FIG. 1 illustrates a manufacturing process showing ion implantation steps performed on a semiconductor substrate.
Figure 2A:
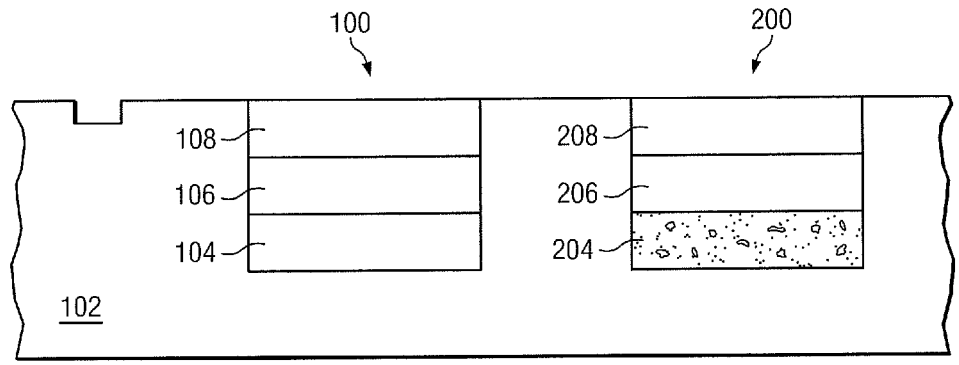
FIGS. 2A-2B illustrate the device structure as a result of the process of FIG. 1.
Figure 2B:
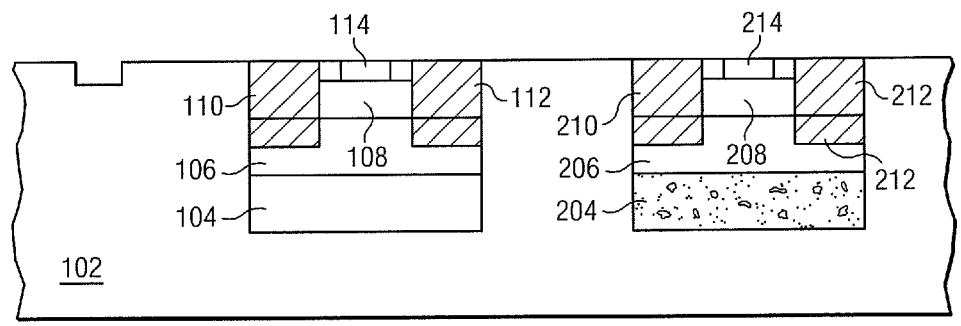

FIG. 1 illustrates manufacturing process 10 in creating a transistor circuit element. Manufacturing process 10 shows steps performed on a semiconductor substrate between source and drain regions of the transistor circuit element. FIGS. 2A-2B illustrate the device structure as a result of process 10. Process 10 begins in block 12 with exposing an implant region 100 of a semiconductor substrate 102. Conventional photoresist techniques may be used to expose implant region 100. After implant region 100 is exposed, a first ion implantation step is performed at block 14. For illustrative purposes, implant region 100 is for a PMOS device. The first ion implantation step forms a n-well layer 104. N-well layer 104 may be formed by a directional Phosphorous implant in an energy range of 100 to 400 KeV and a concentration range of $1e12/cm^2$ to $2e13/cm^2$. For a particular embodiment, this Phosphorous implant may be performed by a four directional implant at an energy of 350 keV and a concentration is $7.5e12/cm^2$. A second ion implantation step is performed at block 16 in implant region 100 to form a punch-through stop layer 106 between deep source and drain regions. Punch-through stop layer 106 may be formed by an Arsenic implant in an energy range of 20 to 100 keV and a concentration range of $1e12/cm^2$ to $1e13/cm^2$. For a particular embodiment, this Arsenic implant may be performed at an energy of 80 keV and a concentration of $6e12/cm^2$. A third ion implantation step is performed at block 18 in implant region 100 to form a doped layer 108. Doped layer 108 may be formed by an Arsenic implant in an energy range of to 10 keV and a concentration range of $5e12/cm^2$ to $1e14/cm^2$. For a particular embodiment, this Arsenic implant may be performed at an energy of 6 keV and a concentration of $3e13/cm^2$. A source region 110 and a drain region 112 would be formed at block 20 that penetrate through the doped layer 108 and into punch-through stop layer 106. The resulting transistor device may employ an undoped epitaxial layer 114.

For an example NMOS device, an implant region 200 is exposed using photoresist. A p-well layer 204 is formed in implant region 200. P-well layer 204 may be formed by a directional Boron implant in an energy range of 50 to 200 keV and a concentration range of $1e12/cm^2$ to $2e13/cm^2$. For a particular embodiment, this Boron implant may be performed by a four directional implant at an energy of 150 keV and a concentration of $7.5e12/cm^2$. P-well layer 204 may also receive a pre-amorphous Germanium implant in an energy range of 20 to 80 keV and a concentration range of $1e14/cm^2$ to $5e15/cm^2$. For a particular embodiment, this Germanium implant may be performed at an energy of 50 keV and a concentration of $5e14/cm^2$. A Carbon implant in an energy range of 1 to 10 keV and a concentration of $5e13/cm^2$ to $5e15/cm^2$ may be performed to retard diffusion of Boron. For a particular embodiment, this Carbon implant may be performed at an energy of 3 keV and a concentration of $3e14/cm^2$. A punch through stop layer 206 is then formed in implant region 200. Punch-through stop layer 206 may be formed by a Boron implant in an energy range of 5 to 40 keV and a concentration range of $1e12/cm^2$ to $1e13/cm^2$. For a particular embodiment, this Boron implant may be performed at an energy of 20 keV and a concentration of 4e12/cm². A doped layer 208 is then formed in implant region 200. Doped layer may be formed by a Boron implant in an energy range of 0.5 to 8 keV and a concentration range of 5e12/cm² to 1e14/cm². For a particular embodiment, this Boron implant may be performed at an energy of 2 keV and a concentration of 3e13/cm². Source and drain regions 210 and 212 can then be formed that penetrate doped layer 208 into punch-through stop layer 206. The resulting transistor device may employ an undoped epitaxial layer 214.

Though described with specific energy and concentration levels, these levels are merely provided for illustrative purposes and other energy and concentration levels as well as materials may be used to create a desired device.

As a result of the formation of the PMOS and NMOS devices, punch-through stop layers 106 and 116 have a lower concentration of dopant impurities than respective doped layers 108 and 118. Punch-through stop layers 106 and 116 prevent punch-through without increasing junction leakage due to their smaller dopant concentration than their respective doped layers 108 and 118.

Although the present disclosure has been described in detail with reference to a particular embodiment, it should be understood that various other changes, substitutions, and alterations may be made hereto without departing from the spirit and scope of the appended claims. For example, although the present disclosure has been described with reference to a specific ordering of processes, other process sequencing may be followed to achieve the end result discussed herein.

Numerous other changes, substitutions, variations, alterations, and modifications may be ascertained by those skilled in the art and it is intended that the present disclosure encompass all such changes, substitutions, variations, alterations, and modifications as falling within the spirit and scope of the appended claims. Moreover, the present disclosure is not intended to be limited in any way by any statement in the specification that is not otherwise reflected in the appended claims.

What is claimed is:

1. A method for reducing punch-through in a transistor device, comprising:
   forming a first well layer in a first implant region for a PMOS device using a directional Phosphorous implant in an energy range of 100 to 400 keV and a concentration range of 1e12/cm² to 2e13/cm²;
   forming a first stop layer in the first well layer of lesser depth than the first well layer using an Arsenic dopant implant in an energy range of 20 to 100 keV and a concentration range of 1e12/cm² to 1e13/cm²;
   forming a first doped layer in the first stop layer of lesser depth than the first stop layer using an Arsenic implant in an energy range of 1 to 10 keV and a concentration range of 5e12/cm² to 1e14/cm², the first stop layer having a lower concentration of dopant impurities than the first doped layer;
   wherein the first stop layer and first doped layer implant conditions are selected so that the first doped layer is above and in contact with the first stop layer;
   forming an epitaxial layer on the first doped layer, wherein the epitaxial layer is undoped;
   forming a resulting transistor device, the resulting transistor device employing the undoped epitaxial layer;
   wherein the undoped epitaxial layer is above and in contact with the first doped layer, and wherein the first stop layer, the first doped layer, and the undoped epitaxial layer comprise a three-layer stack; and
   forming a source region and a drain region, the source and drain regions penetrating the three-layer stack through the first doped layer and partially into the first stop layer.

2. A method for reducing punch-through in a transistor device, comprising:
   forming a well layer in an implant region for a NMOS device using a directional Boron implant in an energy range of 50 to 200 keV and a concentration range of 1e12/cm² to 2e13/cm², a pre-amorphous Germanium implant at in an energy range of 20 to 80 keV and a concentration range of 1e14/cm² to 5e15/cm², and a Carbon implant in an energy range of 1 to 10 keV and a concentration range of 5e13/cm² to 5e15/cm²;
   forming a stop layer in the well layer of lesser depth than the well layer using a Boron implant in an energy range of 5 to 40 keV and a concentration range of 1e12/cm² to 1e13/cm²; and
   forming a doped layer in the stop layer of lesser depth than the stop layer using a Boron implant in an energy range of 0.5 to 8 keV and a concentration range of 5e12/cm² to 1e14/cm², the stop layer having a lower concentration of dopant impurities than the doped layer;
   wherein the stop layer and the doped layer implant conditions are selected so that the doped layer is above and in contact with the stop layer;
   forming an epitaxial layer on the doped layer, wherein the epitaxial layer is undoped;
   forming a resulting transistor device, the resulting transistor device employing the undoped epitaxial layer;
   wherein the undoped epitaxial layer is above and in contact with the doped layer, and wherein the stop layer, the doped layer and the undoped epitaxial layer comprise a three-layer stack; and
   forming a source region and a drain region, the source and drain regions penetrating the three-layer stack through the doped layer and partially into the stop layer.

3. A method for reducing punch-through in a transistor device, comprising:
   forming a first well layer in a first implant region for a PMOS device using a directional Phosphorous implant in an energy range of 100 to 400 keV and a concentration range of 1e12/cm² to 2e13/cm²;
   forming a first stop layer in the first well layer of lesser depth than the first well layer using an Arsenic dopant implant in an energy range of 20 to 100 keV and a concentration range of 1e12/cm² to 1e13/cm²; and
   forming a first doped layer in the first stop layer of lesser depth than the first stop layer using an Arsenic implant in an energy range of 1 to 10 keV and a concentration range of 5e12/cm² to 1e14/cm², the first stop layer having a lower concentration of dopant impurities than the first doped layer;
   wherein the first stop layer and first doped layer implant conditions are selected so that the first doped layer is above and in contact with the first stop layer;
   forming a second well layer in a second implant region for a NMOS device using a directional Boron implant in an energy range of 50 to 200 keV and a concentration range of 1e12/cm² to 2e13/cm², a pre-amorphous Germanium implant in an energy range of 20 to 80 keV and a concentration range of 1e14/cm² to 5e15/cm², and a Carbon implant in an energy range of 1 to 10 keV and a concentration range of 5e13/cm² to 5e15/cm²;
   forming a second stop layer in the second well layer of lesser depth than the second well layer using a Boron implant in an energy range of 5 to 40 keV and a concentration range of 1e12/cm² to 1e13/cm²; and forming a second doped layer in the second stop layer of lesser depth than the second stop layer using a Boron implant in an energy range of 0.5 to 8 keV and a concentration range of $5e12/cm^2$ to $1e14/cm^2$, the second stop layer having a lower concentration of dopant impurities than the second doped layer;

wherein the second stop layer and second doped layer implant conditions are selected so that the second doped layer is above and in contact with the second stop layer;

forming a first epitaxial layer on the first doped layer, wherein the first epitaxial layer is undoped;

forming a second epitaxial layer on the second doped layer, wherein the second epitaxial layer is undoped;

wherein the first stop layer, the first doped layer, and the first epitaxial layer comprise a first three-layer stack;

wherein the second stop layer, the second doped layer, and the second epitaxial layer comprise a second three-layer stack;

forming a first source region and a first drain region, the first source and drain regions penetrating the first three-layer stack through the first doped layer into the first stop layer;

forming a second source region and a second drain region, the second source and drain regions penetrating the second three-layer stack through the second doped layer into the second stop layer;

forming resulting transistor devices, the resulting transistor devices separately employing the undoped first epitaxial layer and the undoped second epitaxial layer.

4. The method of claim 1, wherein the first well layer is directly underneath and in contact with the first stop layer.

5. The method of claim 2, wherein the well layer is directly underneath and in contact with the stop layer.

6. The method of claim 3, wherein:

the first well layer is directly underneath and in contact with the first stop layer; and the second well layer is directly underneath and in contact with the second stop layer.

* * * * *